US008982162B2

(12) United States Patent
Takahashi

(10) Patent No.: US 8,982,162 B2
(45) Date of Patent: Mar. 17, 2015

(54) DISPLAY DEVICE, ELECTRONIC APPARATUS AND DRIVING CODE GENERATING CIRCUIT

(75) Inventor: Nariya Takahashi, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 1153 days.

(21) Appl. No.: 12/707,021

(22) Filed: Feb. 17, 2010

(65) Prior Publication Data

US 2010/0225675 A1 Sep. 9, 2010

(30) Foreign Application Priority Data

Mar. 6, 2009 (JP) ................................ 2009-053054

(51) Int. Cl.

*G09G 5/10* (2006.01)
*H03M 7/46* (2006.01)
*G09G 3/36* (2006.01)
*G09G 3/20* (2006.01)

(52) U.S. Cl.

CPC ............ *G09G 3/3648* (2013.01); *G09G 3/2025* (2013.01); *G09G 3/2029* (2013.01); *G09G 2320/041* (2013.01)
USPC ............................................ 345/690; 341/63

(58) Field of Classification Search

CPC ........... H03M 7/40; H03M 7/46; G06T 9/005
USPC ............. 345/82, 84, 204, 555, 690–691, 693, 345/202
See application file for complete search history.

(56) References Cited

U.S. PATENT DOCUMENTS 5,389,922 A * 2/1995 Seroussi et al. ................ 341/51
5,396,595 A * 3/1995 Standley ......................... 710/68
5,684,865 A * 11/1997 Mohtashemi et al. ... 379/100.17
7,084,861 B2 8/2006 Iisaka
7,088,349 B2 * 8/2006 Iisaka ........................... 345/204
8,531,369 B2 * 9/2013 Toyooka ......................... 345/89
2002/0158857 A1 * 10/2002 Iisaka ........................... 345/204
2003/0072466 A1 * 4/2003 Eisenbraun ................... 381/381
2003/0184809 A1 * 10/2003 Clouthier et al. ............ 358/3.01
2007/0262889 A1 * 11/2007 Kuo et al. ........................ 341/51
2008/0231587 A1 * 9/2008 Takahashi ..................... 345/101
2009/0060047 A1 * 3/2009 Schneider ................ 375/240.23

FOREIGN PATENT DOCUMENTS

JP 2003-114661 4/2003
JP 2008-241975 10/2008

(Continued)

*Primary Examiner* — Matthew Fry
(74) *Attorney, Agent, or Firm* — Maschoff Brennan

(57) ABSTRACT

A display device displays a gray scale by applying a voltage to a display element for each of a plurality of subfields. The display device includes a predetermined code storage unit that stores a predetermined code, in which indication values designating the voltage are arranged, a compression code storage unit that stores a compression code, which includes a first portion designating a number of the indication values and a second portion designating an identifier of the predetermined code, and a developing unit that generates a driving code according to a continuous code, in which indication values designating a first voltage are arranged by the number of the indication values designated by the first portion of the compression code, and a predetermined code corresponding to the identifier designated by the second portion of the compression code.

7 Claims, 8 Drawing Sheets

(56) References Cited

FOREIGN PATENT DOCUMENTS

| | | | | |
|---|---|---|---|---|
| JP | 2008-241975 | A | | 10/2008 |
| JP | 2008241975 | A | * | 10/2008 |

* cited by examiner

DISPLAY DEVICE, ELECTRONIC APPARATUS AND DRIVING CODE GENERATING CIRCUIT

BACKGROUND

1. Technical Field

The present invention relates to a technology capable of displaying gray scale by using a subfield driving scheme.

2. Related Art

According to the related art, there has been proposed a subfield driving scheme in which an on voltage or an off voltage is selectively applied to a display element (e.g., liquid crystal element) in each of a plurality of subfields obtained by dividing a field (for example, see JP-A-2003-114661). Further, JP-A-2008-241975 discloses a technology of storing a code (hereinafter, referred to as "driving code"), which indicate an on voltage or an off voltage in each subfield, in a storage circuit for each gray scale in a state in which the codes have been compressed.

The code (hereinafter, referred to as "compression code") after compression in JP-A-2008-241975 includes a first portion, which designates the number of subfields in which an on voltage is applied and being continuous in a field, and a second portion which designates an on voltage or an off voltage in each of the remaining subfields in the field. Thus, as compared with a configuration of storing a driving code in a non-compression state, the capacity necessary for a storage circuit is reduced.

However, in JP-A-2008-241975, since the second portion of the compression code designates a voltage (on voltage/off voltage) in each subfield, if the total number of subfields in a field is increased to realize multilevel gray scale, the data amount of the second portion is increased proportionally to the total number of the subfields. Therefore, a case may occur in which the capacity necessary for the storage circuit cannot be sufficiently reduced.

SUMMARY

An advantage of some aspects of the invention is to effectively reduce the data amount of a compression code obtained by compressing a driving code.

According to one aspect of the invention, there is provided a display device that displays a gray scale by applying a first voltage or a second voltage to a display element for each of a plurality of subfields obtained by dividing a field, the display apparatus including: a predetermined code storage unit that stores a predetermined code, in which indication values designating any one of the first voltage and the second voltage are arranged, for each identifier; a compression code storage unit that stores a compression code, which includes a first portion designating the number of the indication values (the number of subfields) and a second portion designating an identifier of the predetermined code, for each gray scale; a developing unit that generates a driving code according to a continuous code, in which indication values designating the first voltage are arranged by the number of the indication values designated by the first portion of the compression code, and a predetermined code corresponding to the identifier designated by the second portion of the compression code; and a driving circuit that applies any one of the first voltage and the second voltage to the display element for each subfield of the field based on the driving code generated by the developing unit with respect to a designated gray scale of the display element. The display device of the invention is used for various types of electronic apparatuses (e.g., personal computers or cell phones).

With such a configuration, since the compression code obtained by compressing the driving code is stored in the compression code storage unit, the capacity necessary for the compression code storage unit can be reduced, as compared with a configuration of storing the driving code in a non-compression state. Further, since the second portion of the compression code corresponds to the identifier of the predetermined code, it is advantageous in that the data amount of the compression code (in addition, the capacity necessary for the compression code storage unit) can be effectively reduced, as compared with the configuration of JP-A-2008-241975 in which the second portion of the compression code designates a voltage of each subfield. The above effect is particularly significant when the total number of the subfields in the field is increased to realize multilevel gray scale.

In addition, the compression code storage unit and the predetermined code storage unit are mounted as separate storage circuits. However, the compression code storage unit and the predetermined code storage unit may be provided as separate storage areas set in a single storage circuit. Further, the scope of the invention includes both a configuration (e.g., the first embodiment which will be described later) in which the developing unit sequentially develops a compression code corresponding to gray scale whenever the gray scale is designated (gray scale data is supplied), and a configuration (e.g., the second embodiment which will be described later) in which the developing unit develops in advance (before the display element starts to operate) a compression code corresponding to each gray scale.

According to a preferred embodiment of the invention, when the number of the indication values designated by the first portion of the compression code exceeds a predetermined value, the developing unit generates the driving code, which includes a predetermined number of indication values, by arranging the continuous code and a part of the predetermined code. Further, according to another preferred embodiment, when the number of the indication values designated by the first portion of the compression code is less than the predetermined value, the developing unit generates the driving code, which includes a predetermined number of indication values, by arranging the continuous code, the predetermined code, and at least one indication value designating the second voltage. According to the above embodiments, it is advantageous in that the driving code, which includes a desired number of indication values, can be generated while reducing the data amount of the compression code. In addition, it is preferred to employ a configuration in which the developing unit generates the driving code by disposing the indication value designating the second voltage between the continuous code and the predetermined code.

According to a preferred embodiment of the invention, each second portion of at least two compression codes stored in the compression code storage unit designates a common identifier. According to the above embodiment, since a common predetermined code is used for the generation of the driving code of at least two gray scales, the driving code can be generated using predetermined codes having a number smaller than the number of the gray scales. Thus, as compared with a configuration in which the predetermined code is necessary for each gray scale, it is advantageous in that the capacity necessary for the predetermined code storage unit is reduced.

According to a preferred embodiment of the invention, the compression code storage unit stores a plurality of first tables in which the compression code is set for each gray scale, the predetermined code storage unit stores a plurality of second tables in which the predetermined code is set for each identifier, a selecting unit is provided to select any one of the plurality of first tables and any one of the plurality of second tables, and the developing unit generates the driving code by using the first and second tables selected by the selecting unit. According to the above embodiment, since any one of the plurality of first tables and any one of the plurality of second tables are selected for the generation of the driving code, a relationship between a designated gray scale and the driving code can be appropriately changed. For example, after a temperature detection member, which detects the operation temperature (temperature of a display panel or peripheral temperature of the display panel) of the display panel, is provided, the selecting unit selects the first table and the second table according to the temperature detected by the temperature detection member.

The invention is also specified as a circuit (driving code generating circuit) which generates a driving code in which indication values designating any one of a first voltage and a second voltage applied to a display element are arranged for each subfield in a field. The driving code generating circuit of the invention includes: a predetermined code storage unit that stores a predetermined code, in which the indication values designating any one of the first voltage and the second voltage are arranged, for each identifier; a compression code storage unit that stores a compression code, which includes a first portion designating a number of the indication values and a second portion designating an identifier of the predetermined code, for each gray scale; and a developing unit that generates a driving code according to a continuous code, in which indication values designating the first voltage are arranged by the number of the indication values designated by the first portion of the compression code, and a predetermined code corresponding to the identifier designated by the second portion of the compression code. According to the above driving code generating circuit, the same effect as that obtained by the display device of the invention can be realized.

BRIEF DESCRIPTION OF THE DRAWINGS

The invention will be described with reference to the accompanying drawings, wherein like numbers reference like elements.

DESCRIPTION OF EXEMPLARY EMBODIMENTS

A: First Embodiment

Figure 1:
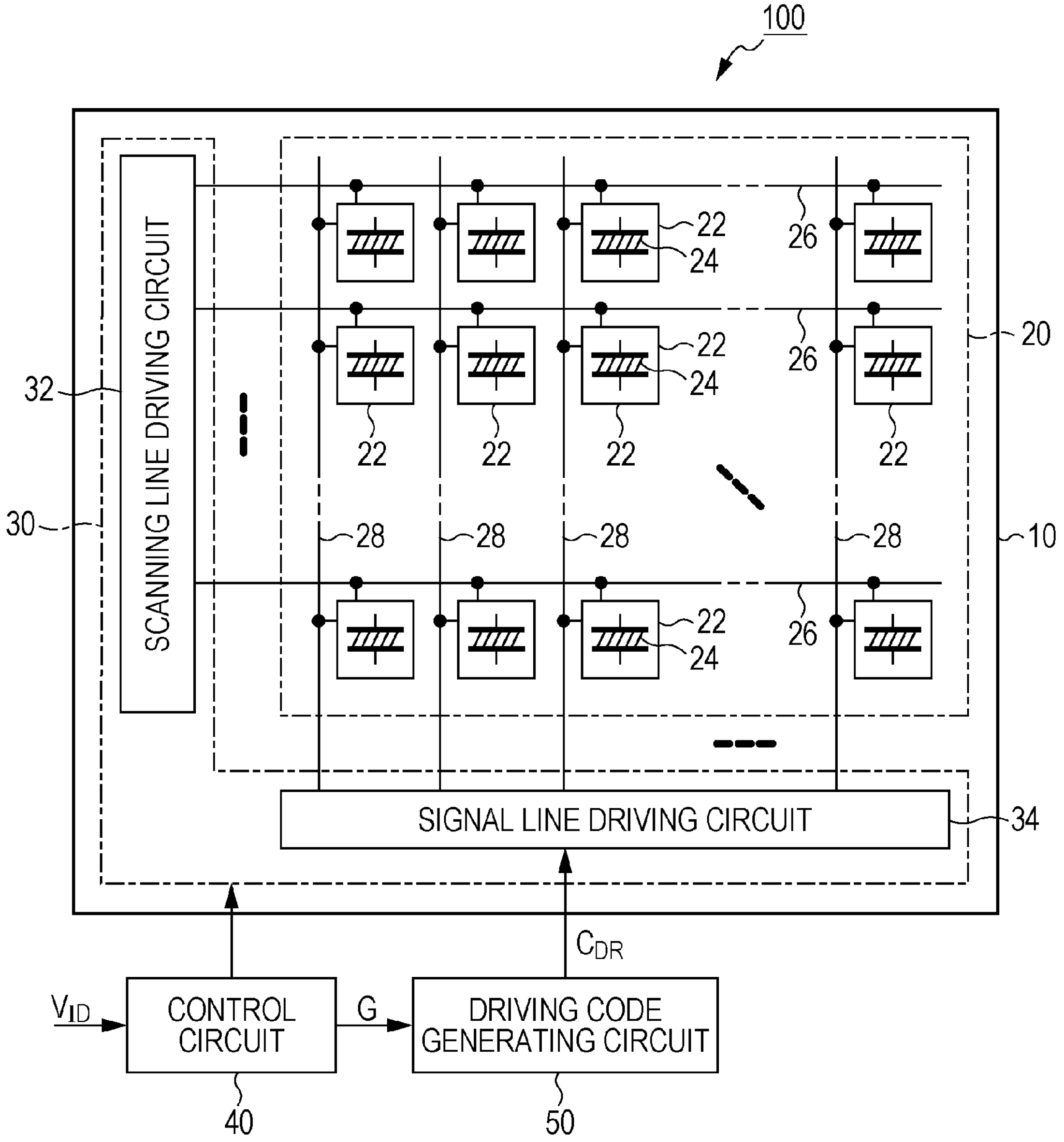
FIG. 1 is a block diagram illustrating a display device according to a first embodiment.

FIG. 1 is a block diagram illustrating a display device 100 according to a first embodiment of the invention. As illustrated in FIG. 1, the display device 100 includes a display panel 10, a control circuit 40 and a driving code generating circuit 50. The control circuit 40 and the driving code generating circuit 50, for example, are mounted on the surface of a board constituting the display panel 10, or the surface of a wiring board bonded to a liquid crystal panel. In addition, the control circuit 40 and the driving code generating circuit 50 can be prepared in the form of a single integrated circuit.

The display panel 10 includes a pixel unit (display area) 20 in which a plurality of pixel circuits 22 are arranged, and a driving circuit 30 that drives each pixel circuit 22. In the pixel unit 20, M scanning lines 26 and N signal lines 28 extend in the direction in which they cross each other (M and N are natural numbers). The pixel circuits 22 are each disposed at positions corresponding to each crossing of the scanning lines 26 and the signal lines 28, and arranged in a matrix shape of (vertical M rows×horizontal N columns). Each pixel circuit 22 includes a liquid crystal element 24 in which the transmittance of liquid crystal varies depending on a voltage (a potential difference between a pixel electrode and an opposite electrode) between both ends thereof. The voltage between both ends of the liquid crystal element 24 is set according to the voltage of the signal line 28 when the scanning line 26 is selected.

Figure 2:
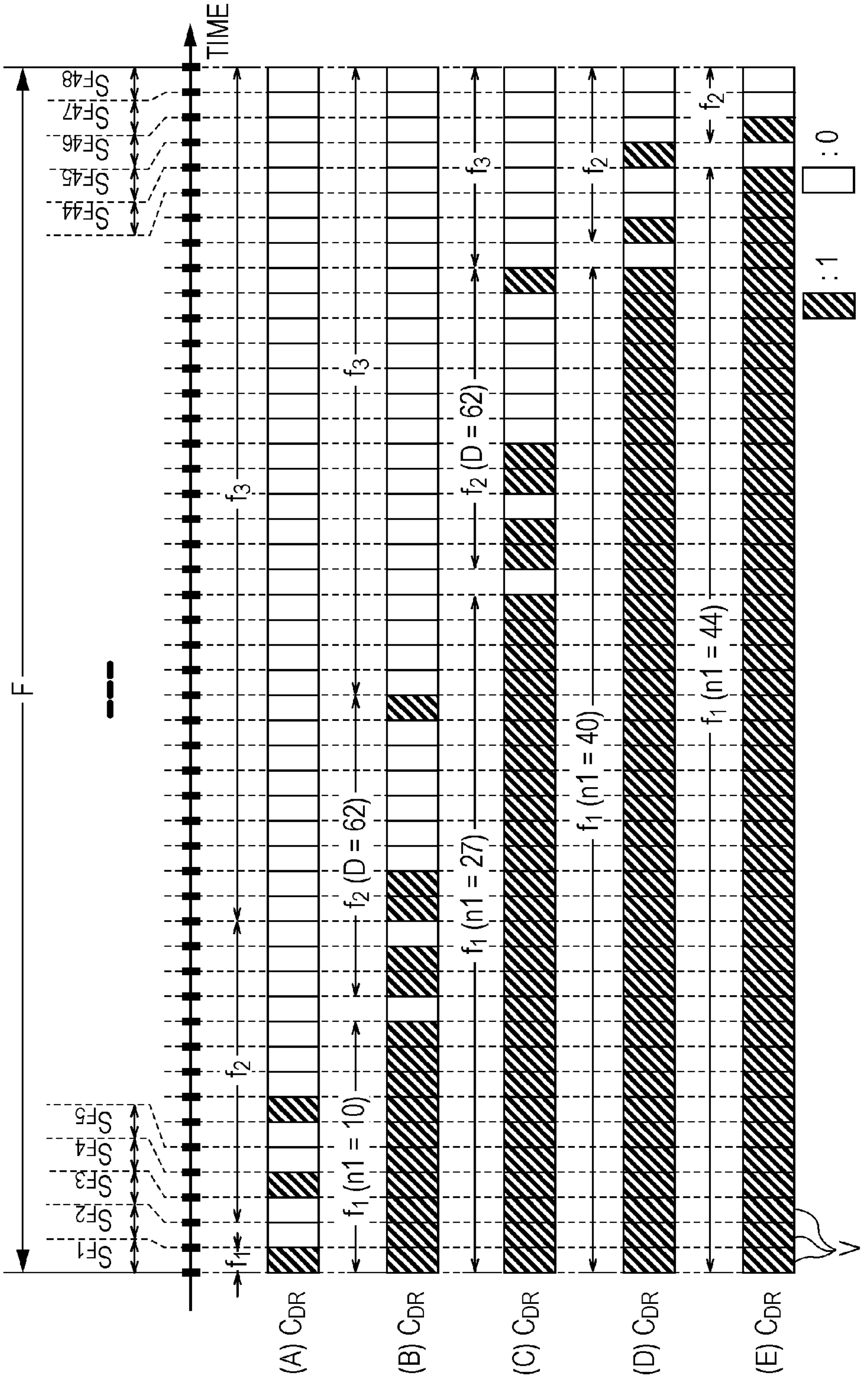
FIG. 2 is a diagram schematically illustrating a relationship between each subfield and each indication value of a driving code.

The driving circuit 30 controls the transmittance (reflectivity) of each liquid crystal element 24 by driving the plurality of pixel circuits 22, respectively. The driving circuit 30 drives each pixel circuit 22 (each liquid crystal element 24) by using a subfield driving scheme. That is, as illustrated in FIG. 2, the driving circuit 30 selectively applies any one of an on voltage and an off voltage to the liquid crystal element 24 of each pixel circuit 22 in each of 48 subfields SF (SF1 to SF48) obtained by dividing each field F having a predetermined length. The on voltage serves as a voltage (e.g., a voltage for turning on the liquid crystal element 24) for changing the transmittance of the liquid crystal element 24, and the off voltage serves as a voltage (e.g., a voltage for turning off the liquid crystal element 24) set such that the voltage between both ends of the liquid crystal element 24 is less than when the on voltage is applied. In addition, the number of the subfields SF in the field F may be appropriately changed.

As illustrated in FIG. 2, time length of each of the subfields SF (SF1 to SF48) is in common. In detail, the time of each subfield SF is set to be shorter than the time until the transmittance (reflectivity) of the liquid crystal element 24 is saturated after the on voltage or the off voltage starts to be applied to the liquid crystal element 24. The setting of the subfield SF as described above is disclosed in detail in JP-A-2003-114661.

The control circuit 40 of FIG. 1 controls the entire operation of the display device 100 by generating and outputting various types of signals. The control circuit 40 receives an image signal VID from a high level apparatus (not shown). The control circuit 40, for example, generates a control signal (synchronization signal) for defining the field F and each subfield SF to supply the driving circuit 30 or the driving code generating circuit 50 with the control signal. Further, the control circuit 40 generates gray scale data G, which designates gray scale of each pixel circuit 22, from the image signal VID to sequentially supply the driving code generating circuit

50 with the gray scale data G. The gray scale data G, for example, is generated by performing a predetermined correction processing (e.g., Gamma correction) with gray scale designated by the image signal VID. According to the embodiment, the gray scale data G denotes 8-bit data designating any one of 256 gray scale levels.

The driving code generating circuit 50 converts the gray scale data G, which is sequentially supplied from the control circuit 40, into a driving code CDR. As illustrated in (A) to (E) of FIG. 2, the driving code CDR is a sequence of 48 indication values X corresponding to each of the 48 subfields SF1 to SF48 in the field F. The indication value X corresponding to each subfield SF is a numerical value for designating the voltage, which is applied to the liquid crystal element 24 in the subfield SF, to any one (any one of the turning on and the turning off of the liquid crystal element 24) of the on voltage and the off voltage. In detail, the indication value X is set to any one of "1", which is a numerical value for designating the on voltage, and "0" which is a numerical value for designating the off voltage. Thus, the driving code CDR can be formed with 48 bits. In FIG. 2 or the following FIG. 5, rectangles indicated by oblique lines denote the numerical value "1" and rectangles not indicated by oblique lines denote the numerical value "0". The driving code CDR generated by the driving code generating circuit 50 is sequentially supplied to the driving circuit 30.

The content of the driving code CDR is experimentally selected such that gray scale represented by the gray scale data G and the emission light amount (time-integrated value of transmittance) from the liquid crystal element 24 in one field F satisfy a desired relationship (gray scale-luminance characteristics). That is, after the emission light amount (time integrated value of transmittance) from the liquid crystal element 24 is sequentially measured in each of a plurality of cases of changing both the ratio of the number of the subfields SF, in which the on voltage is applied, in one field F and the number of the subfields SF in which the off voltage is applied, and the arrangement (hereinafter, referred to as "voltage applying pattern") of the respective subfields SF, 256 types of voltage applying patterns, through which the emission light amount corresponding to each gray scale represented by the gray scale data G is obtained, are extracted from a plurality of voltage applying patterns, and then driving codes CDR (256 types of driving codes CDR corresponding to each gray scale which can be designated by the gray scale data G) corresponding to each voltage applying pattern after the extraction are determined.

In detail, in order that the ratio of the time for which the on voltage (or off voltage) is applied to the liquid crystal element 24 in one field F coincides with the ratio corresponding to the gray scale data G of each pixel circuit 22, each indication value X of the driving codes CDR is determined for each gray scale represented by the gray scale data G. For example, when the liquid crystal element 24 is set in a normally white mode, the driving codes CDR are determined such that, as the gray scale of the gray scale data G is high, the number of the subfields SF, in which the on voltage is applied to the liquid crystal element 24, is reduced (i.e., time length for which the transmittance of the liquid crystal element 24 is reduced by the applied on voltage is shortened). Meanwhile, when the liquid crystal element 24 is set in a normally black mode, the driving codes CDR are generated such that, as the gray scale designated by the gray scale data G is high, the number of the subfields SF, in which the on voltage is applied to the liquid crystal element 24, is increased.

Referring to FIG. 2 in which each indication value X of the driving codes CDR corresponds to each subfield SF of the field F for the purpose of convenience, one field F is schematically divided into first to third sections f1 to f3. In the first section f1, the subfield SF, in which the on voltage is applied to the liquid crystal element 24, continues from the head (subfield SF1) of the field F. The number n1 of subfields SF constituting the first section f1 is set to vary depending on the gray scale data G in a range of 0 to 48 (the total number of subfields SF in the field F). Except for the case in which the first section f1 is formed over the whole range of the field F (the number of the subfields SF constituting the first section f1 is 48), a subfield (sometimes written as "boundary subfield" in the following description) SF immediately after the first section f1 serves as the subfield SF in which the off voltage is applied to the liquid crystal element 24.

In the second section f2, the subfields SF in which the on voltage is applied to the liquid crystal element 24 and the subfields SF in which the off voltage is applied to the liquid crystal element 24 coexist with the ratio of the respective numbers of the subfields SF and the arrangement thereof corresponding to the gray scale data G. As illustrated in (A) to (C) of FIG. 2, the second section f2, basically, includes the number n2 (12 in the embodiment) of subfields SF immediately after the boundary subfield SF, wherein n2 is a fixed value. However, as illustrated in (D) and (E) of FIG. 2, when the number (48−n1−1) of subfields SF obtained by excluding the n1 subfields SF in the first section f1 and one boundary subfield SF from one field F is less than the number n2 of the subfields SF (48−n1−1<n2), that is, when the number n1 of the subfields SF in the first section f1 exceeds a predetermined threshold value Nth (Nth=47−n2), the second section f2 includes the remaining number of subfields SF (the number of subfields SF which is less than n2) consecutive to the boundary subfield SF.

In the third section f3, the subfield SF, in which the off voltage is applied to the liquid crystal element 24, continues immediately after the second section f2. As illustrated in (A) to (C) of FIG. 2, the third section f3, basically, includes the remaining subfields SF (the number of the remaining subfields SF is (48−n1−1−n2)) after the first section f1, the boundary subfield SF and the second section f2 are excluded from one field F. Thus, when the sum (n1+1+n2) of the number n1 of the subfields SF in the first section f1, the number 1 of the boundary subfields SF and the number n2 of the subfields SF in the second section f2 is equal to or larger than the total number of the subfields SF in the field F, that is, when the number n1 of the subfields SF in the first section f1 is equal to or larger than the predetermined threshold value Nth (Nth=47−n2), the third section f3 is not set in the field F. In other words, when the number n1 of the subfields SF is less than the threshold value Nth, the third section f3 is set.

The driving circuit 30 of FIG. 1 drives each pixel circuit 22 (liquid crystal element 24) by using the driving codes CDR generated by the driving code generating circuit 50. That is, the driving circuit 30 applies the on voltage to the liquid crystal element 24 of the pixel circuit 22 in subfields SF, in which the indication value X is set to the numerical value "1" by the driving codes CDR of each pixel circuit 22, while applying the off voltage to the liquid crystal element 24 of the pixel circuit 22 in subfields SF, in which the indication value X is set to the numerical value "0".

As illustrated in FIG. 1, the driving circuit 30 includes a scanning line driving circuit 32 and a signal line driving circuit 34. The scanning line driving circuit 32 sequentially selects each (set of N pixel circuits 22 of each row) of the M scanning lines 26 for each subfield SF of each field F. That is, one scanning line 26 is selected 48 times in one field F.

The signal line driving circuit 34 outputs a voltage (on voltage/off voltage) corresponding to each indication value X of the driving code CDR to each signal line 28 in synchronization with the selection of each scanning line 26 by the scanning line driving circuit 32. In detail, in a period in which the scanning line 26 of an $i^{th}$ row (i=1 to M) of one subfield SF is selected, the signal line driving circuit 34 outputs a voltage, which is represented by the indication value X of the subfield SF in the driving code CDR obtained by converting the gray scale data G of the pixel circuit 22 located at a $j^{th}$ column (j=1 to N) of the $i^{th}$ row, to the signal line 28 of the $j^{th}$ column. The voltage output to the signal line 28 of the $j^{th}$ column when the scanning line 26 of the $i^{th}$ row is selected is applied to the liquid crystal element 24 of the pixel circuit 22 located at the $j^{th}$ column of the $i^{th}$ row. Thus, the liquid crystal element 24 of each pixel circuit 22 is controlled according to gray scale (transmittance) corresponding to the gray scale data G in units of the field F.

Figure 3:
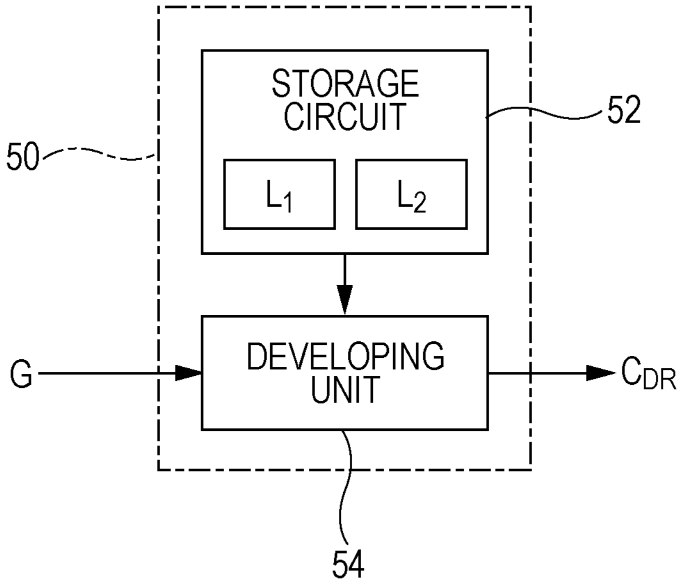
FIG. 3 is a block diagram illustrating a driving code generating circuit of FIG. 1.

FIG. 3 is a detailed block diagram illustrating the driving code generating circuit 50 of FIG. 1. As illustrated in FIG. 3, the driving code generating circuit 50 includes a storage circuit 52 and a developing unit 54. The storage circuit 52 denotes a memory (e.g., a ROM) for storing a first table L1 and a second table L2.

Figure 4:
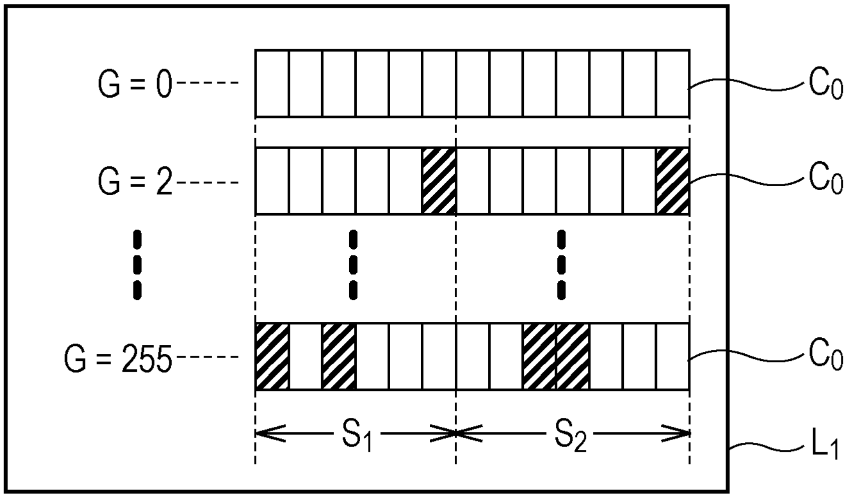
FIG. 4 is a diagram schematically illustrating a first table.

FIG. 4 is a diagram schematically illustrating the first table L1. As illustrated in FIG. 4, the first table L1 denotes a look-up table in which compression codes C0 obtained by compressing the driving codes CDR of each gray scale according to predetermined rules are arranged for each gray scale of the gray scale data G, that is, the gray scale data G corresponds to the compression codes C0. Since gray scale data designates any one of 256 gray scale levels (0 to 255), 256 types of compression codes C0 corresponding to each gray scale are stored in the first table L1.

As illustrated in FIG. 4, each compression code C0 includes a first portion S1 and a second portion S2. The first portion S1 designates the number n1 of the subfields SF constituting the first section f1. The first portion S1 of the compression code C0 is formed with 6 bits (fixed length) such that the maximum value (n1=48) of the number n1 of the subfields SF constituting the first section f1 can be designated.

Figures 5A, 5B, 5C, 5D, 5E:
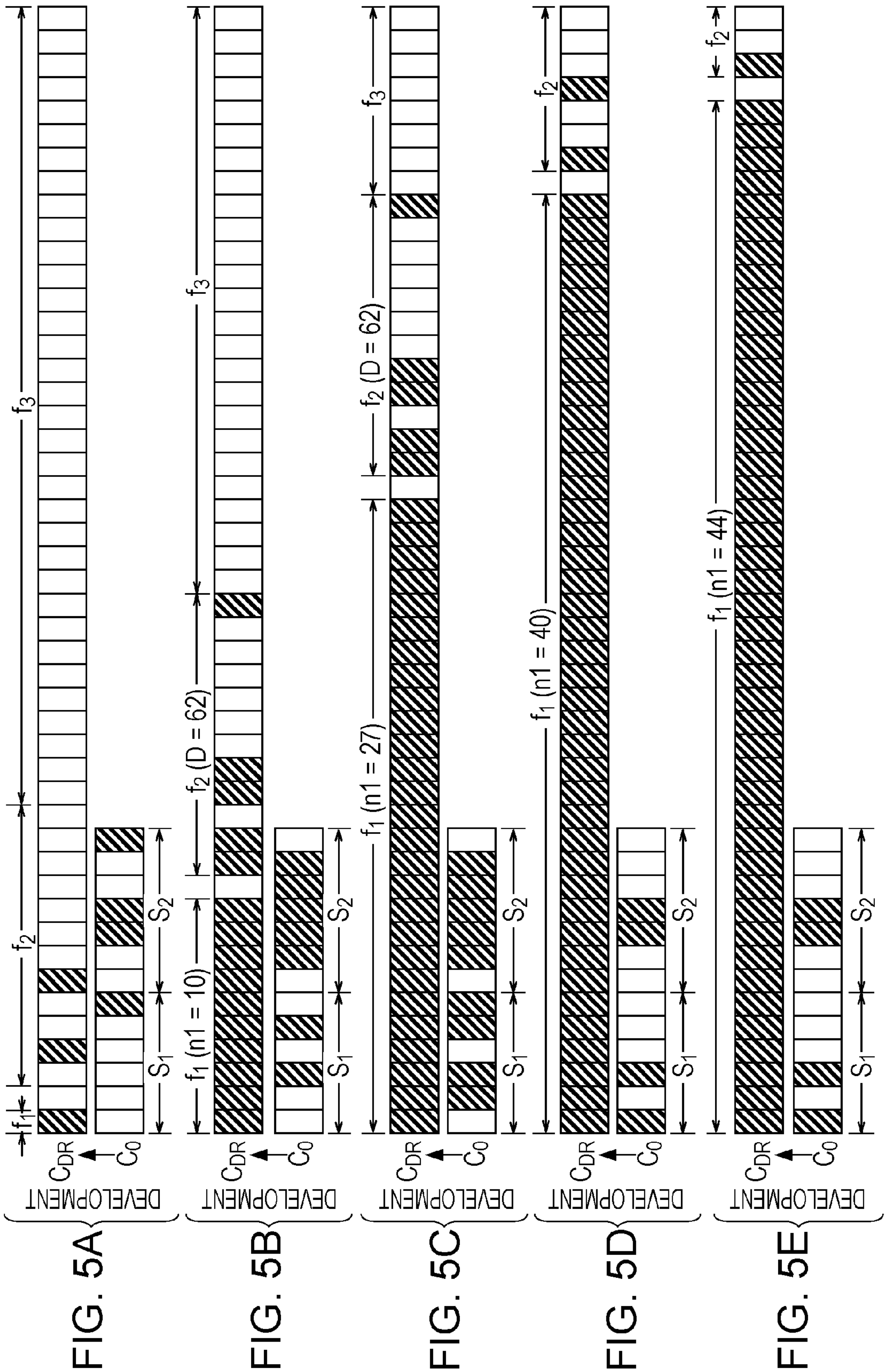
FIGS. 5A to 5E are diagrams schematically illustrating a relationship between a driving code and a compression code.

FIGS. 5A to 5E are diagrams schematically illustrating the driving codes CDR illustrated in (A) to (E) of FIG. 2 and compression codes C0 obtained by compressing the driving codes CDR. In the case of the driving code CDR illustrated in FIG. 5A, in a compression code C0 corresponding to gray scale in which one subfield SF exists in the first section f1, the first portion S1 is set to "000001" representing decimal number 1. Further, as illustrated in FIG. 5B, in a compression code C0 corresponding to gray scale in which the number of subfields SF in the first section f1 is 10, the first portion S1 of the compression code C0 is set to "001010" representing decimal number 10. The first portions S1 of compression codes C0 corresponding to other gray scales are set according to the same rules.

Figure 6:
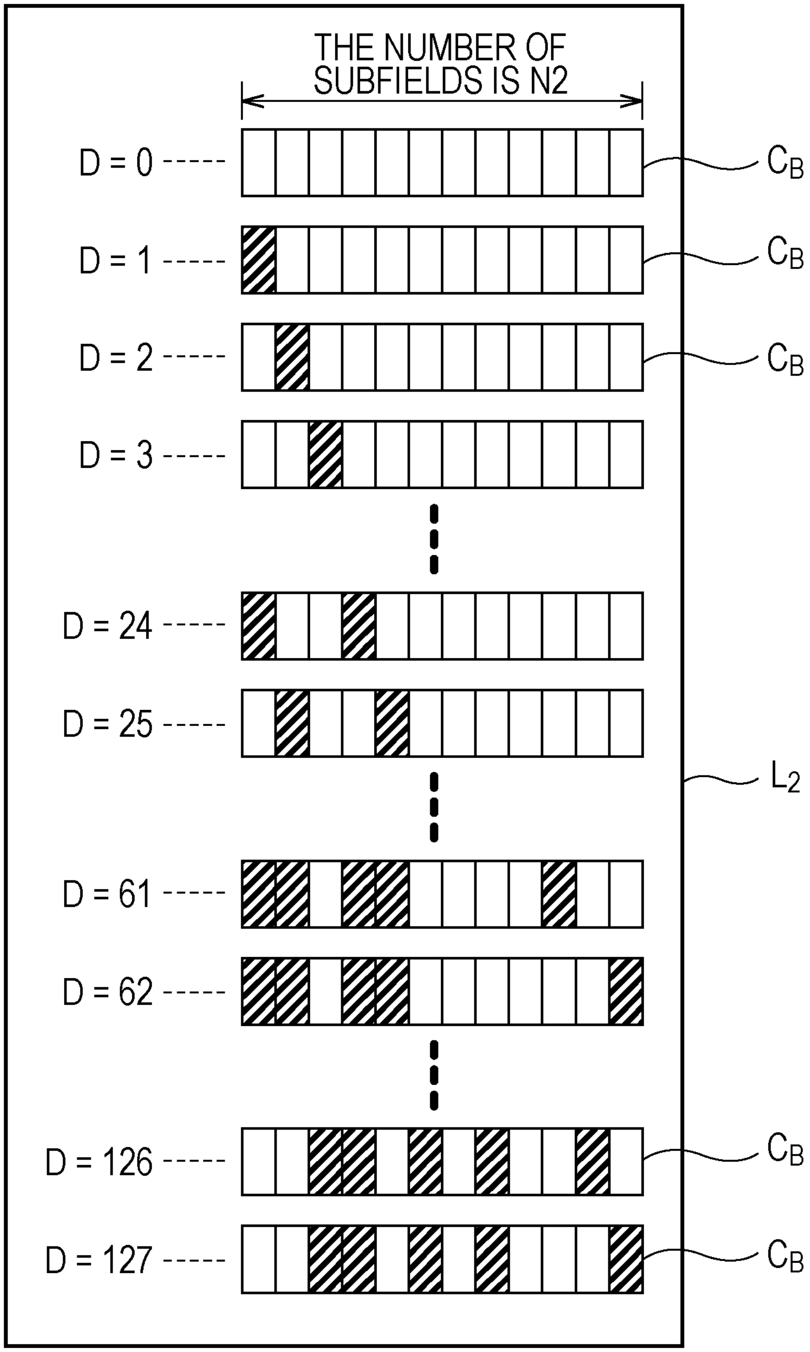
FIG. 6 is a diagram schematically illustrating a second table.

FIG. 6 is a diagram schematically illustrating the second table L2. As illustrated in FIG. 6, the second table L2 denotes a look-up table in which a plurality of types of predetermined codes CB are arranged for each identifier D, that is, the identifiers D correspond to the predetermined codes CB. The identifier D denotes a sign (number) peculiarly assigned to each predetermined code CB to distinguish the plurality of predetermined codes CB from each other. The second portion S2 of the compression code C0 of FIG. 4 designates the identifier D of any one of the plurality of predetermined codes CB in the second table L2.

The predetermined code CB is a sequence of n2 indication values X for designating the on voltage and the off voltage with respect to each of the n2 subfields SF in the second section f2. As described above for the driving code CDR, each indication value X of the predetermined code CB is set to any one of the numerical value "1" for designating the on voltage and the numerical value "0" for designating the off voltage. Thus, the predetermined code CB can be formed with n2 bits (12 bits in the embodiment).

The predetermined code CB is used as a part corresponding to each subfield SF in the second section f2 of the driving code CDR. For example, the predetermined code CB of FIG. 6, which has an identifier D having been set to 25, is used as a part corresponding to the second section f2 of the driving code CDR illustrated in FIG. 5A. Further, the predetermined code CB, which has an identifier D having been set to 62, is used as a part corresponding to the second section f2 of the driving code CDR illustrated in FIG. 5B.

As illustrated in the driving code CDR of FIG. 5B and the driving code CDR of FIG. 5C, even in the case of displaying gray scales different from each other, a case may occur in which a voltage applying pattern of the second section f2 is in common. That is, one predetermined code CB can be used in common as a part corresponding to the second section f2 by a plurality of driving codes CDR corresponding to gray scales different from each other. In other words, in the first table L1, the second portions S2 of at least two compression codes C0 designate a common identifier D. As described above, since each predetermined code CB is used in common by the plurality of driving codes CDR, the number of the predetermined codes CB stored in the second table L2 is smaller than the total number of gray scales which can be designated by the gray scale data G. In detail, the number of gray scales designated by the gray scale data G is 256, but the total number of the predetermined codes CB stored in the second table L2 is 128. In order to distinguish 128 types of predetermined codes CB from each other, the second portion S2 (identifier D) of the compression code C0 is formed with 7 bits (fixed length). That is, one compression code C0 is formed with 13 bits (fixed length).

Further, in the second table L2, the number of indication values X having the numerical value "1" is in common, but a plurality of predetermined codes CB, in which the positions (positions of subfields SF in which the on voltage is applied) of the indication values X are different from each other, are included. For example, in relation to the predetermined codes CB having identifiers D set to 1 to 3 as illustrated in FIG. 6, the number of indication values X having the numerical value "1" is one in common, but the positions of the indication values X are different from each other. Since time length of each subfield SF is less than the time until the transmittance of the liquid crystal element 24 is saturated as described above, even if the number of subfields SF of the second section f2, in which the on voltage is applied, is in common, if the positions of the subfields SF are different from each other, emission light amounts (gray scales) of the liquid crystal element 24 in the field F are different from each other. Thus, in the second table L2, the plurality of predetermined codes CB, in which the number of indication values X having the numerical value "1" is in common but the positions of the indication values X are different from each other, can be used to display gray scales different from each other.

Figure 7:
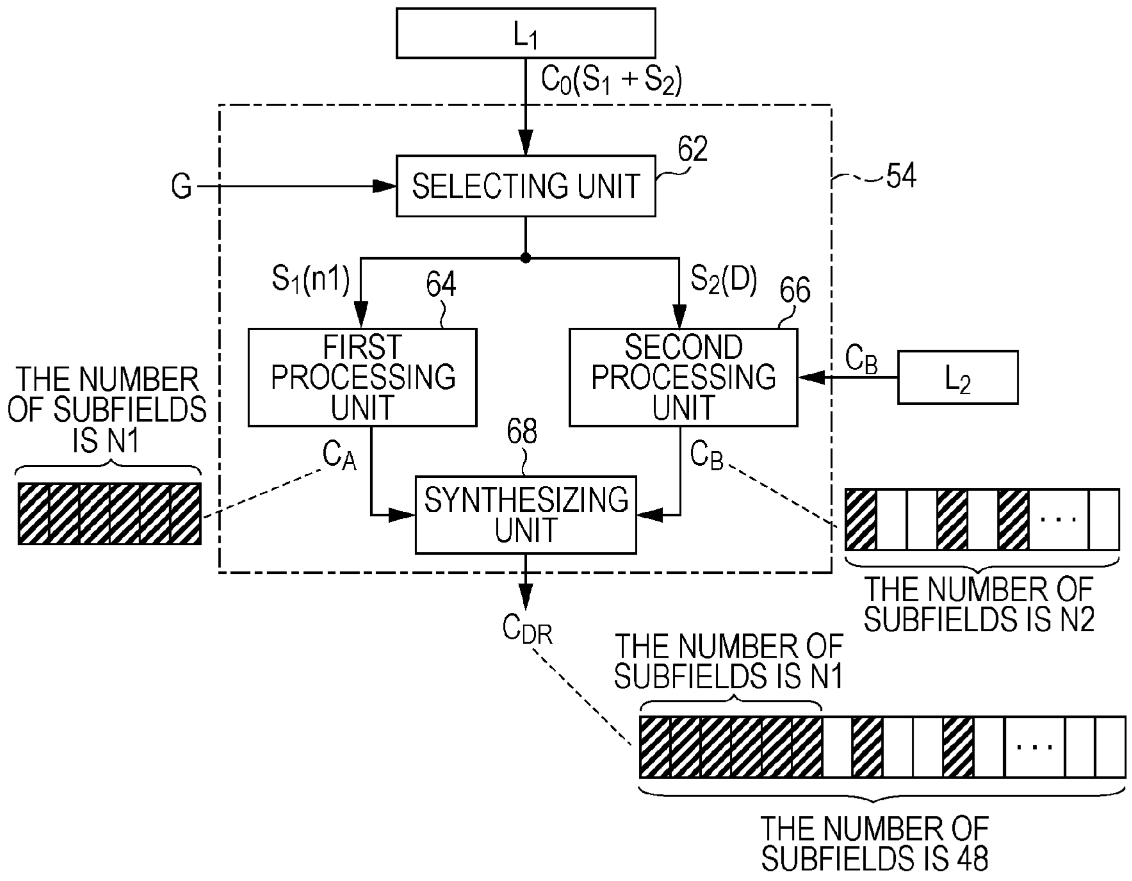
FIG. 7 is a block diagram illustrating a developing unit of FIG. 3.

The developing unit 54 of FIG. 3 generates the driving codes CDR, which correspond to the gray scale data G sequentially supplied from the control circuit 40, by using the first table L1 and the second table L2. FIG. 7 is a detailed block diagram illustrating the developing unit 54. As illustrated in FIG. 7, the developing unit 54 includes a selecting unit 62, a first processing unit 64, a second processing unit 66 and a synthesizing unit 68. The selecting unit 62 selects a compression code C0, which corresponds to the gray scale data G supplied from the control circuit 40, from the 256 types of compression codes C0 stored in the first table L1.

As illustrated in FIG. 7, the first processing unit 64 generates a sequence code CA in which the numerical values "1s" (indication values X designating the on voltage) of the n1 subfields SF designated by the first portion S1 of the compression code C0 selected by the selecting unit 62 are arranged. Meanwhile, the second processing unit 66 selects a predetermined code CB, which corresponds to an identifier D designated by the second portion S2 of the compression code C0 selected by the selecting unit 62, from the 128 types of predetermined codes CB stored in the second table L2. As illustrated in FIG. 7, the synthesizing unit 68 generates the driving code CDR from the sequence code CA generated by the first processing unit 64 and the predetermined code CB selected by the second processing unit 66. A method of generating the driving code CDR will be described in detail below.

When the number n1 of the subfields SF designated by the first portion S1 of the compression code C0 is less than the threshold value Nth (Nth=47−n2), the synthesizing unit 68 interposes the indication value X of the numerical value "0", which corresponds to the boundary subfield SF, between the sequence code CA and the predetermined code CB, and adds (48−n1−1−n2) indication values X of the numerical value "0" immediately after the predetermined code CB, thereby generating the driving code CDR including 48 indication values X. The indication values X of the numerical value "0" added immediately after the predetermined code CB indicate application of the off voltage in each subfield SF of the third section f3.

For example, as illustrated in FIG. 5B, when the first portion S1 of the compression code C0 corresponding to the gray scale data G is set to "001010" (n1=10) and the second portion S2 is set to "0111110" (D=62), the first processing unit 64 generates the sequence code CA in which 10 indication values X of the numerical value "1" are arranged, and the second processing unit 66 specifies the predetermined code CB, in which the identifier D is 62, from the second table L2 of FIG. 6. Then, the synthesizing unit 68 interposes the indication value X of the numerical value "0" between the sequence code CA and the predetermined code CB, and adds 25 (=48−10−1−12) indication values X of the numerical value "0" immediately after the predetermined code CB, thereby generating the driving code CDR of FIG. 5B.

Meanwhile, when the number n1 of the subfields SF designated by the first portion S1 of the compression code C0 exceeds the threshold value Nth, the synthesizing unit 68 interposes the indication value X of the numerical value "0", which corresponds to the boundary subfield SF, between the sequence code CA and the predetermined code CB, and destroys (n1+1+n2−48) indication values X of the rear side of the predetermined code CB, thereby generating the driving code CDR including 48 indication values X. That is, the driving code CDR when the number n1 of the subfields SF exceeds the threshold value Nth does not include an indication value X corresponding to the third section f3.

For example, as illustrated in FIG. 5D, when the first portion S1 of the compression code C0 corresponding to the gray scale data G is set to "101000" (n1=40) and the second portion S2 is set to "0011000" (D=24), the first processing unit 64 generates the sequence code CA in which 40 indication values X of the numerical value "1" are arranged, and the second processing unit 66 specifies the predetermined code CB, in which the identifier D is 24, from the second table L2 of FIG. 6. Then, the synthesizing unit 68 interposes the indication value X of the numerical value "0" between the sequence code CA and the predetermined code CB, and destroys 5 (=40+1+12−48) indication values X of the rear side of the predetermined code CB, thereby generating the driving code CDR of FIG. 5D.

When the number n1 of the subfields SF exceeds the threshold value Nth as described above, since the predetermined code CB is partially destroyed, the content of a part destroyed from the predetermined code CB is arbitrary. For example, since 9 indication values X of the rear side of the predetermined code CB are destroyed when the number n1 of the subfields SF is 44 as illustrated in FIG. 5E, if the initial three indication values X of the predetermined code CB designated by the second portion S2 of the compression code C0 are set to "100", the content of the remaining indication values X is ignored. Thus, for example, in FIG. 5E, the second portion S2 of the compression code C0 is set to "0011000" representing decimal number 24. However, even if the second portion S2 of the compression code C0 are set to "0000001" (D=1) of the identifier D of the predetermined code CB in which the initial three indication values X are set to "100", the content of the driving code CDR generated by the driving code generating circuit 50 is in common.

In addition, when the number n1 of the subfields SF designated by the first portion S1 of the compression code C0 coincides with the threshold value Nth, that is, when (n1+1+n2=48) is established, the synthesizing unit 68 interposes the indication value X of the numerical value "0" between the sequence code CA generated by the first processing unit 64 and the predetermined code CB generated by the second processing unit 66, thereby generating the driving code CDR including 48 indication values X. That is, addition of indication values X (numerical value is "0") consecutive to the predetermined code CB or partial destruction of the predetermined code CB is not performed.

According to the above-described embodiment, since the compression code C0 obtained by compressing the driving code CDR is stored in the storage circuit 52, it is advantageous in that the capacity necessary for the storage circuit 52 can be reduced, as compared with the configuration in which the driving code CDR in a non-compression state is stored in the storage circuit 52 and is used for the conversion of the gray scale data G. In addition, since the second portion S2 of the compression code C0 corresponds to the identifier D of the predetermined code CB, it is advantageous in that the data amount (moreover, the capacity necessary for the storage circuit 52) of the compression code C0 can be reduced, as compared with the configuration of JP-A-2008-241975 in which the second portion S2 of the compression code C0 designates the voltage applying pattern in the second section f2. The effect of the reduction in the data amount of the compression code C0 becomes significant as the number of the subfields SF constituting the second section f2 is increased. Since it is necessary to increase the number of the subfields SF in the second section f2 in order to increase the number of gray scales by reducing the width of gray scale, the first embodiment is advantageous in that multilevel gray scale can be effectively realized while reducing the capacity necessary for the storage circuit 52.

Further, addition of the indication values X of the numerical value "0" is performed when the number n1 of the subfields SF is less than the threshold value Nth, and the partial destruction (ignition) of the predetermined code CB is performed when the number n1 of the subfields SF exceeds the threshold value Nth, so that it is not necessary to regulate the addition of the numerical value “0” or the partial destruction of the predetermined code CB by the compression code C0. Thus, as compared with the configuration in which the addition of the numerical value “0” or the partial destruction of the predetermined code CB is designated by the compression code C0, the data amount of the compression code C0 can be reduced. In addition, the indication value X of the numerical value “0” corresponding to the boundary subfield SF is automatically added between the sequence code CA and the predetermined code CB, so that the data amount of the compression code C0 can be reduced, as compared with the configuration in which the voltage of the boundary subfield SF is designated by the compression code C0.

B: Second Embodiment

Next, the second embodiment of the invention will be descried. In the first embodiment, the developing unit 76 sequentially develops the gray scale data G, which is output from the control circuit 40 during the operation of the display panel 10, to the driving code CDR. In the second embodiment, the driving code CDR of each gray scale is developed before the display panel 10 starts to operate (e.g., immediately after the display device 100 is powered on). In addition, in the following embodiment, modified examples and application, the same reference numerals are used to designate elements having operations and functions identical to those of the first embodiment, and detailed description thereof will be omitted in order to avoid redundancy.

Figure 8:
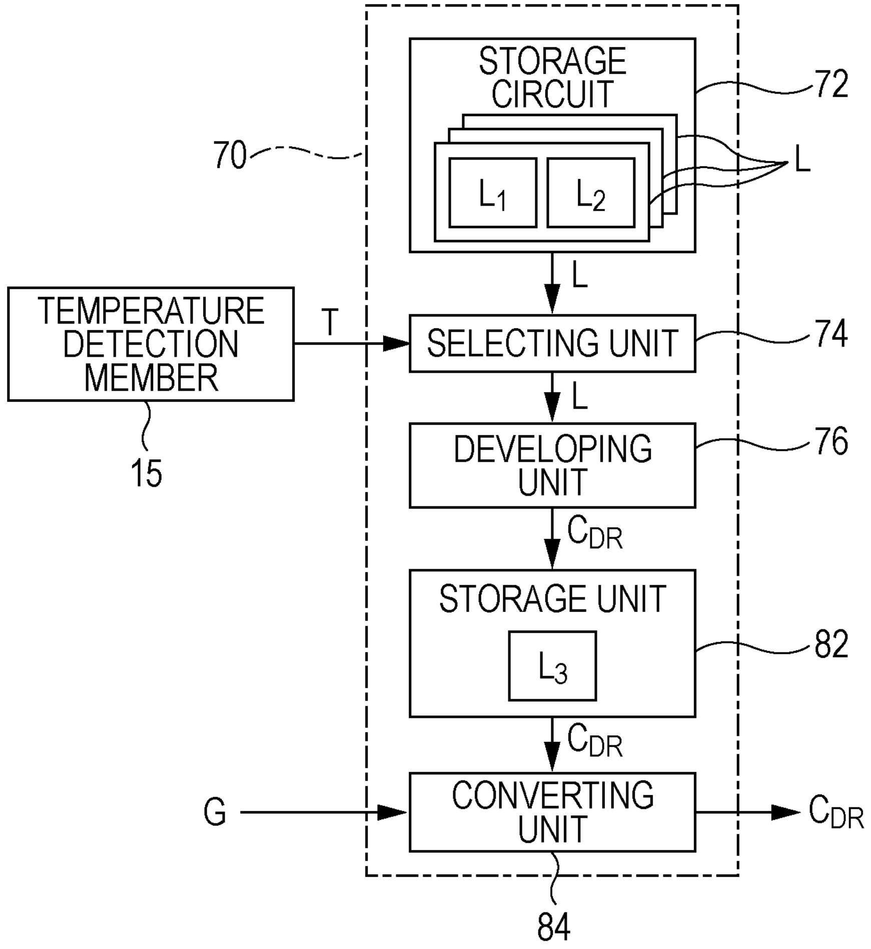
FIG. 8 is a block diagram illustrating a driving code generating circuit according to a second embodiment.

The second embodiment employs a driving code generating circuit 70 of FIG. 8, instead of the driving code generating circuit 50 according to the first embodiment. As illustrated in FIG. 8, a temperature detecting member 15 is connected to the driving code generating circuit 70. The temperature detecting member 15 includes a sensor that detects the temperature of each element (ideally, the liquid crystal element 24) of the display panel 10 or the peripheral temperature T of the display panel 10, and is provided in an element (e.g., a board) constituting the display panel 10 or a casing for receiving the display panel 10. For example, a resistive element (thermistor) having a resistance value varying depending on the peripheral temperature T is employed as the temperature detecting member 15.

As illustrated in FIG. 8, the driving code generating circuit 70 includes a storage circuit 72, a selecting unit 74, a developing unit 76, a storage unit 82 and a converting unit 84. The storage circuit 72 serves as a memory (e.g., a ROM) for storing a plurality of tables L for each temperature T (actually, each range of the temperature T). One table L includes a first table L1 having the same structure as that of the first table L1 of FIG. 4, and a second table L2 having the same structure as that of the second table L2 of FIG. 6. That is, the storage circuit 72 stores a plurality of first tables L1 and a plurality of second tables L2.

Since movement of the liquid crystal element 24 is dependent on the temperature T, the voltage applying pattern (the driving code CDR), in which each gray scale of the gray scale data G and the emission light amount from the liquid crystal element 24 satisfy a desired relationship, varies depending on the temperature T. The first table L1 and the second table L2 of the table L corresponding to the specific temperature T are set such that the 256 types of driving codes CDR determined under the temperature T can be generated. Thus, the contents of the first table L1 and the second table L2 are different from each other for each table L (i.e., each temperature T).

Before the display panel 10 starts to operate (e.g., immediately after power is supplied thereto), the selecting unit 74 of FIG. 8 selects a table L, which corresponds to the temperature T detected by the temperature detecting member 15, from the plurality of tables L in the storage circuit 72. The developing unit 76 develops each of the 256 types of compression codes C0 stored in the first table L1 of the table L selected by the selecting unit 74. The compression codes C0 are developed by the same method as that of the first embodiment. That is, the developing unit 76 generates the driving codes CDR from the sequence code CA, in which the indication values X of the numerical value “1” are arranged by the number n1 of subfields SF designated by the first portion S1 of the compression code C0, and the predetermined code CB of the second table L2, which corresponds to the identifier D designated by the second portion S2 of the compression code C0.

The storage unit 82 stores the 256 types of driving codes CDR obtained after the compression codes C0 are developed by the developing unit 76. That is, a table L3, in which the driving codes CDR are arranged for each gray scale, that is, a look-up table L3, in which the gray scale data G corresponds to the driving codes CDR, is generated in the storage unit 82 before the display panel 10 starts to operate. After the display panel 10 starts to operate, the converting unit 84 converts the gray scale data G, which is sequentially supplied from the control circuit 40, into the driving codes CDR. That is, the converting unit 84 searches for the driving codes CDR, which correspond to the gray scale data G, from the table L3 of the storage unit 82, and sequentially outputs the driving codes CDR to the signal line driving circuit 34.

According to the above configuration, since only a table L, which correspond to the actual temperature T, is developed among the plurality of tables L corresponding to different temperatures T, it is advantageous in that the capacity necessary for the storage circuit 72 can be reduced, as compared with the configuration in which each of the plurality of tables L stores the driving codes CDR of each gray scale in a non-compression state. In addition, since the second portion S2 of the compression code C0 corresponds to the identifier D of the predetermined code CB, similarly to the first embodiment, it is advantageous in that the data amount of the compression code C0 can be effectively reduced. According to the second embodiment, since the plurality of tables L are stored in the storage circuit 72, the effect of the reduction in the data amount of the compression code C0 is particularly significant.

C: Modified Example

The previous embodiments are modified in various types. Detailed modified examples for the previous embodiments are exemplified as follows. In addition, two or more modified examples arbitrarily selected from the following examples can be appropriately combined.

1 First Modified Example

The order (in addition, order of the sequence code CA and the predetermined code CB) of the first section f1, the second section f2 and the third section f3 according to the previous embodiments may be appropriately changed. For example, it may be possible to employ a configuration in which the third section f3 is located prior to the second section f2 and the second section f2 is located prior to the first section f1. The developing units 54 and 76 add the indication value X of “0” corresponding to the boundary subfield SF just prior to the sequence code CA, connect the predetermined code CB just prior to the indication value X, and add the indication value X (indication value X corresponding to the third section f3) of “0” just prior to the predetermined code CB, thereby generating the driving codes CDR including 48 indication values X. Further, in the configuration in which the third section f3 is interposed between the first section f1 and the second section f2, an appropriate number of numerical values “0s” are disposed between the sequence code CA and the predetermined code CB.

2 Second Modified Example

According to the previous embodiments, when the number n1 of the subfields SF exceeds the threshold value Nth, the predetermined code CB is partially destroyed. However, it may be possible to employ a configuration of storing the predetermined code CB, which includes (48−n1−1) indication values X corresponding to the number n1 of the subfields SF exceeding the threshold value Nth, in the second table L2 and using the predetermined code CB for the generation of the driving code CDR, that is, a configuration of storing a plurality of predetermined codes CB which have a different number of indication values X. Further, according to the previous embodiments, when the number n1 of the subfields SF is less than the threshold value Nth, the indication values X of the numerical value “0” are compensated such that the number of the indication values X is 48. However, it may be possible to employ a configuration in which a shortage (the number of the compensated 0s) of the indication values X is designated by the compression code C0.

3 Third Modified Example

According to the second embodiment, the table L is selected according to the temperature T. However, a criterion for selecting the table L is not limited to the temperature T. For example, it may be possible to employ a configuration of selecting any one of a plurality of tables L according to peripheral illumination of the display panel 10. Further, it may be possible to employ a configuration in which the first table L1 and the second table L2 are prepared for each display color (e.g., each color of RGB) of the liquid crystal element 24, or a configuration in which pseudo contour is controlled by selectively using a plurality of tables L3, which are generated from the tables L different from each other, for generation of the driving codes CDR. According to the above configurations, since it is necessary to store the plurality of tables in the storage circuits 52 and 72, the effect of the invention, that is, the reduction in the data amount of the driving code C0, is particularly effective.

4 Fourth Modified Example

According to the previous embodiments, the first portion S1 of the driving code C0 designates the number n1 of the subfields SF in which the on voltage is applied. However, it may be possible to employ a configuration in which the first portion S1 designates the number of the subfields SF in which the off voltage is applied.

5 Fifth Modified Example

The display element used for the display of an image is not limited to the liquid crystal element 24. In relation to a display element applied to the display device of the invention, a self-emission type display element, which emits light by itself, is not distinguished from a non-emission type display element (e.g., the liquid crystal element 24) which changes transmittance or reflectivity of external light, or a current driving type display element, which is driven by the supply of electric current, is not distinguished from a voltage driving type display element which is driven by the application of an electric field (voltage). For example, the invention can be applied to a display device using various display elements such as organic EL elements, inorganic EL elements, FE (Field-Emission) elements, SE (Surface conduction Electron emitter) elements, BS (Ballistic electron Emitting) elements, LED (Light Emitting Diode) elements, electrophoresis elements or electrochromic elements. That is, the display element includes an electro-optic element having optical properties (gray scale) changed in response to an electrical action (supply of electric current or application of voltage).

D: Application

Figure 9:
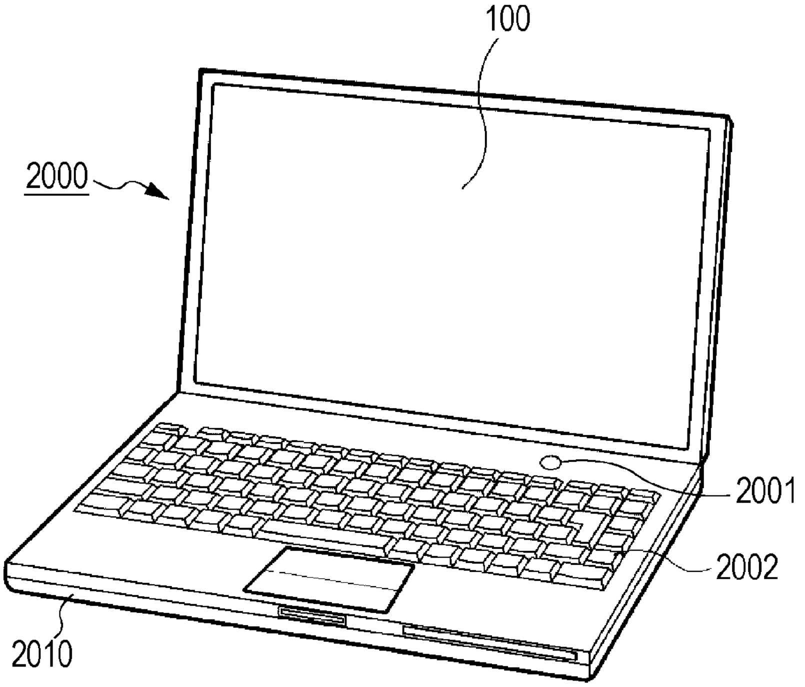
FIG. 9 is a perspective view illustrating an electronic apparatus (personal computer).

Next, an electronic apparatus using the display device 100 according to the previous embodiments will be described. FIG. 9 is a perspective view illustrating the configuration of a mobile type personal computer employing the display device 100. The personal computer 2000 includes the display device 100, which displays various types of images, and a body 2010 provided with a power switch 2001 and a keyboard 2002.

Figure 10:
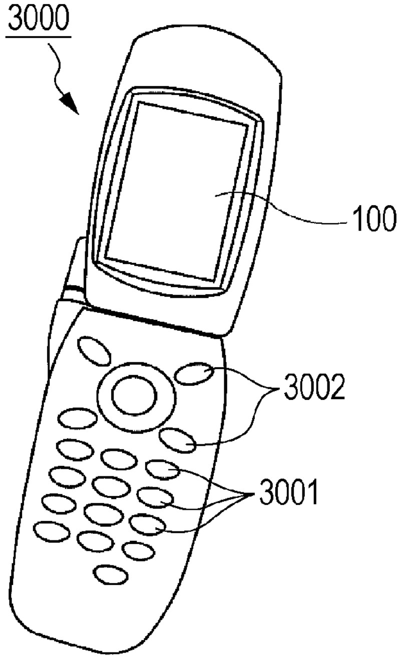
FIG. 10 is a perspective view illustrating an electronic apparatus (cell phone).

FIG. 10 is a perspective view illustrating the configuration of a cell phone employing the display device 100. The cell phone 3000 includes a plurality of operation buttons 3001, a scroll button 3002, and the display device 100 which displays various types of images. A screen displayed on the display device 100 is scrolled by operating the scroll button 3002.

Figure 11:
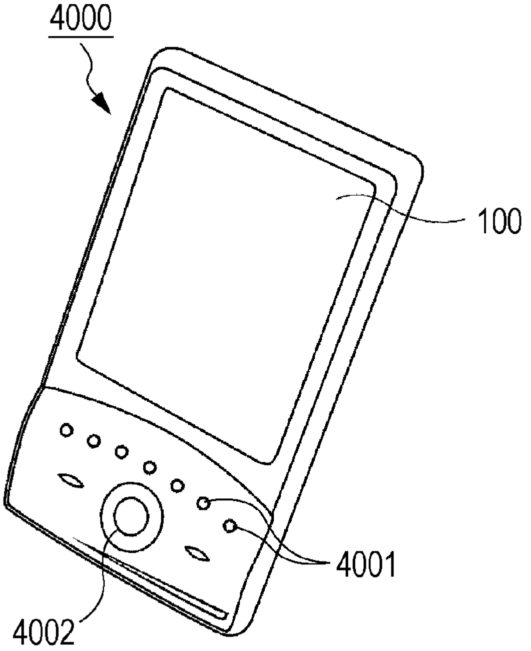
FIG. 11 is a perspective view illustrating an electronic apparatus (PDA).

FIG. 11 is a perspective view illustrating the configuration of a PDA (Personal Digital Assistants) employing the display device 100. The PDA 4000 includes a plurality of operation buttons 4001, a power switch 4002, and the display device 100 which displays various types of images. If the power switch 4002 is operated, various pieces of information stored in an address book or a schedule book is displayed on the display device 100.

In addition to the apparatuses exemplified in FIGS. 9 to 11, an electronic apparatus, to which the display device 100 according to the invention is applied, includes a digital still camera, a television, a video camera, a car navigation apparatus, a pager, an electronic organizer, an electronic paper, a calculator, a word processor, a workstation, a television phone, a POS terminal, a printer, a scanner, copy machine, a video player, an apparatus provided with a touch panel, and the like.

The entire disclosure of Japanese Patent Application No. 2009-053054, filed Mar. 6, 2009 is expressly incorporated by reference herein.

What is claimed is:

1. A display device that displays a gray scale by applying a first voltage or a second voltage to a display element for each of a plurality of sub fields obtained by dividing a field, the display device comprising:

a predetermined code storage unit that stores a predetermined code, in which indication values designating any one of the first voltage and the second voltage are compressed by correlating the indication values with a corresponding identifier;

a compression code storage unit that stores a compression code, which includes a first portion designating a number of the indication values and a second portion designating an identifier of the predetermined code, for each gray scale;

a developing unit that generates a driving code according to a continuous code, in which indication values designating the first voltage are arranged by the number of the indication values designated by the first portion of the compression code, and a predetermined code corresponding to the identifier designated by the second portion of the compression code; and a driving circuit that applies any one of the first voltage and the second voltage to the display element for each subfield of the field based on the driving code generated by the developing unit with respect to a designated gray scale of the display element, wherein, when the number of the indication values designated by the first portion of the compression code exceeds a predetermined value, the developing unit generates the driving code, which includes a predetermined number of indication values, by arranging the continuous code, a part of the predetermined code shortened by truncating on the rear part of the predetermined code, and at least one indication value designating the second voltage which is interposed between the continuous code and the part of the predetermined code.

2. The display device according to claim 1, wherein, when the number of the indication values designated by the first portion of the compression code is less than a predetermined value, the developing unit generates the driving code, which includes a predetermined number of indication values, by arranging the continuous code, the predetermined code, and at least one indication value designating the second voltage.

3. The display device according to claim 1, wherein the developing unit generates the driving code by arranging an indication value designating the second voltage between the continuous code and the predetermined code.

4. The display device according to claim 1, wherein each second portion of at least two compression codes stored in the compression code storage unit designates a common identifier.

5. The display device according to claim 1, wherein the compression code storage unit stores a plurality of first tables in which the compression code is set for each gray scale, the predetermined code storage unit stores a plurality of second tables in which the predetermined code is set for each identifier, a selecting unit is provided to select any one of the plurality of first tables and any one of the plurality of second tables, and the developing unit generates the driving code by using the first and second tables selected by the selecting unit.

6. An electronic apparatus provided with the display device according to claim 1.

7. A driving code generating circuit that generates a driving code in which indication values designating any one of a first voltage and a second voltage applied to a display element are arranged for each subfield of a field, the driving code generating circuit comprising:

a predetermined code storage unit that stores a predetermined code, in which the indication values designating any one of the first voltage and the second voltage are compressed by correlating the indication values with a corresponding identifier;

a compression code storage unit that stores a compression code, which includes a first portion designating a number of the indication values and a second portion designating an identifier of the predetermined code, for each gray scale; and a developing unit that generates a driving code according to a continuous code, in which indication values designating the first voltage are arranged by the number of the indication values designated by the first portion of the compression code, and a predetermined code corresponding to the identifier designated by the second portion of the compression code, wherein, when the number of the indication values designated by the first portion of the compression code exceeds a predetermined value, the developing unit generates the driving code, which includes a predetermined number of indication values, by arranging the continuous code, a part of the predetermined code shortened by truncating on the rear part of the predetermined code, and at least one indication value designating the second voltage which is interposed between the continuous code and the part of the predetermined code.

* * * * *